United States Patent [19]

Michel et al.

[11] Patent Number: 5,357,213

[45] Date of Patent: Oct. 18, 1994

[54] HIGH-FREQUENCY WIDE BAND AMPLIFIER HAVING REDUCED IMPEDANCE

[75] Inventors: Jean Michel, Trappes; Jean-Claude Combe, Villiers St Paul; Herminio de Faria, l'Isle Adam, all of France

[73] Assignee: Thomson-Lgt Laboratoire General des Telecommunications, Conflans Sainte Honorine, France

[21] Appl. No.: 131,965

[22] Filed: Oct. 8, 1993

[30] Foreign Application Priority Data

Oct. 9, 1992 [FR] France ............................ 92 12031

[51] Int. Cl.⁵ ............................................. H03F 3/60
[52] U.S. Cl. ..................................... 330/286; 330/302; 330/273; 330/296
[58] Field of Search ............... 330/286, 302, 301, 275, 330/273, 123, 296, 261, 262

[56] References Cited

U.S. PATENT DOCUMENTS

| | | | |
|---|---|---|---|
| 3,869,678 | 3/1975 | Mahoney | 330/53 |
| 4,682,119 | 7/1987 | Michel | 330/149 |
| 4,916,410 | 4/1990 | Littlefield | 330/295 |
| 5,270,814 | 12/1993 | Michel | 358/139 |

FOREIGN PATENT DOCUMENTS

| | | |
|---|---|---|
| 2837817 | 3/1979 | Fed. Rep. of Germany. |
| 0248606 | 11/1986 | Japan .................. 330/262 |

OTHER PUBLICATIONS

Nachrichten Elektronik vol. 32, No. 2 Feb. 1978, Heidelberg pp. 48–50.
Patent Abstract of Japan, vol. 13, No. 450 (E–830), Oct. 11, 1989, JP-A-11 74 106, Jul. 10, 1989.
Symposium Record Broadcast Sessions Report No.: NC09101, Jan. 16, 1991, pp. 823–852, M. J. Koppen, "High Power Solid State Amplifiers for TV Band IV.V Transmitters Using BLV62 Transistor".

*Primary Examiner*—James B. Mullins
*Assistant Examiner*—Jim Dudek
*Attorney, Agent, or Firm*—Oblon, Spivak, McClelland, Maier & Neustadt

[57] ABSTRACT

A high-frequency wideband power amplifier, of the type comprising an amplifier stage with at least two transistors mounted as a differential stage, coupled at input and at output to a matching circuit further comprises, in order to convey each bias voltage to the amplifier stage, at least one high-frequency transmission line section with a length close to a quarter of the wavelength of the carrier of the signal to be amplified, the impedance of which, brought in parallel on each transistor, is negligible with respect to the high frequencies and the series impedance of which is negligible in the baseband of the signal to be amplified; the line sections conveying the bias voltages to the input of each transistor are identical to one another in length and in impedance, and the same is the case for the line sections conveying the bias voltages to the output of each transistor.

4 Claims, 3 Drawing Sheets

HIGH-FREQUENCY WIDE BAND AMPLIFIER HAVING REDUCED IMPEDANCE

BACKGROUND OF THE INVENTION

1. Field of the Invention

The present invention relates to a high-frequency wideband amplifier.

2. Description of the Prior Art

It is known that a power amplifier working as a class AB, B or C amplifier has a non-linear behavior.

This non-linear behavior takes the form notably of a variation of the current consumed by the amplifier as a function of the level of the amplified signal. The supply sources of the collector and of the base of the bipolar transistor or transistors with which such amplifiers are generally fitted out are considered to have zero impedance with respect to the transistors. If not, the resultant variations in voltage lead to an amplitude modulation of the amplified signal that gets added to the original modulation of the signal. These supply sources are generally not directly applied to the base and the collector of the transistor or transistors of the power stage, but by means of decoupling coils between the DC current and the high frequencies. These coils are also often called chokes.

Conventionally, a first type of high-frequency power amplifier is formed essentially by a power stage, comprising one or more parallel-mounted transistors that are connected respectively to the input and the output of the amplifier circuit by means of an impedance-matching circuit, or impedance transformer. The input and output impedance transformers respectively match the impedances presented by the base and the collector of the transistor with the impedance of the high frequency circuit, generally the characteristic impedance of the circuit $Z_c = 50$ Ohms. The supply voltages of the transistor are applied respectively to its collector and base by means of a coil or choke. The impedance presented by the choke should be, firstly, sufficiently great with respect to the input and output impedances of the transistor in the range of the working frequencies of the amplifier, so that its effect is negligible on the high-frequency operation of the amplifier and, secondly, as low as possible in the videofrequency baseband of the signal to be transmitted, which is of the order of 0 to 10 MHz for a television signal. Consequently, the voltage developed between the ends of each coil is reduced to the maximum and consequently makes it possible to prevent an additional modulation on the bias voltages that could prompt a distortion of the signal to be amplified. One of the drawbacks of this assembly is the difficulty of arriving at a satisfactory compromise to determine the value of this impedance.

A second type of assembly, which is akin to the foregoing assembly and has a symmetrical structure, uses two transistors or a dual transistor and makes possible to facilitate the impedance matching between the external circuit with 50 Ω characteristic impedance and the impedances presented by the amplifier stage.

The DC bias voltages of the transistors are applied respectively to the base and the collector of each transistor by means of a choke and are therefore still subjected to the imperatives of the foregoing assembly.

In a third known type of amplifier assembly, input/output balancing transformers are used to convey the bias voltages respectively to the base and the collector of each transistor of the dual transistor. This assembly makes it possible to obtain a "cold" point for the high-frequency signal, namely a point that is decoupled with respect to the high frequencies and that has the respective voltage source at the base and collector of each transistor applied to it. Thus, this third assembly makes it possible to avoid the need for the foregoing compromise.

In this assembly, the dual transistor is considered to work as a differential amplifier. A continuous link is also provided between the point of application of the base voltage and the base of each transistor, it being assumed that the input impedance transformer has a continuous link between its input terminals and its output terminals. The collector circuit is deduced from the input circuit described here above by symmetry with respect to the amplifier stage. In this last-named type of amplifier, the supply voltages of the base and of the collector of each transistor are applied to cold points for the high frequencies, thus making it possible to do away with the constraints entailed by chokes in the videofrequency baseband.

However, not all the problems are resolved by this last-named assembly, and new drawbacks appear. Thus, the impedance transformer has a continuous link between its input and output terminals and this may be an irksome constraint, and the impedances presented by the balancing transformer and the impedance transformer in the link between the point of application of the base/collector voltages of the transistor remain high in the baseband of the amplifier.

SUMMARY OF THE INVENTION

The aim of the present invention is to overcome the above-mentioned drawbacks.

To this effect, an object of the invention is to provide a high-frequency wideband power amplifier organized around a ground circuit used as a reference potential, of the type comprising, in succession from the input to the output, a first balancing transformer, to the output of which there is injected a signal E to be amplified, an input impedance transformer, an amplifier stage comprising at least two transistors, an output impedance transformer and a second balancing transformer delivering the input signal as an amplified signal S, wherein said amplifier further comprises at least one high-frequency transmission line section transmitting each bias voltage respectively to the input and output terminal of each transistor, showing in parallel, at each terminal, a high-frequency impedance such that its effect is negligible in relation to the high-frequency impedance shown by each transistor terminal and showing a negligible series impedance in the baseband of the signal E to be amplified such that the bias voltage applied to one of the ends of the line section is transmitted almost identically to its other end connected to a transistor terminal, and wherein each line section respectively transmitting the input bias voltage to each transistor has identical high-frequency impedance and identical length ranging from $\lambda/8$ to $3\lambda/8$, where $\lambda$ corresponds to the wavelength of the carrier of the signal E to be amplified, and wherein each line section respectively transmitting the output bias voltage to each transistor has identical impedance and identical length ranging from $\lambda/8$ to $3\lambda/8$.

The main advantage of the invention is that it sets up a low impedance connection of the voltage sources supplying the amplifier without sacrificing the high-frequency operation of the amplifier while, at the same time, obtaining quality performance characteristics, notably in the transmission of television signals.

BRIEF DESCRIPTION OF THE DRAWINGS

Other characteristics and advantages of the invention shall appear from the following description, made with reference to the appended drawings, of which.

DESCRIPTION OF THE INVENTION

Figure 1:
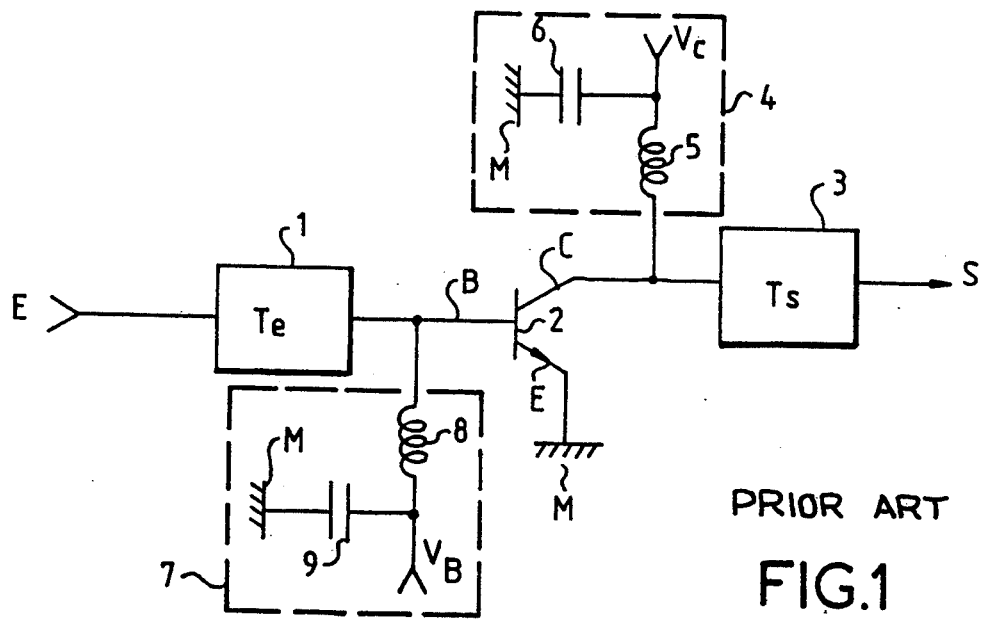
FIGS. 1 to 3 show three electrical diagrams of high-frequency amplifiers according to the prior art.

The electrical diagram of FIG. 1 comprises, from the input E to the output S, an impedance transformer 1, $T_e$ receiving, at its input E, the high-frequency signal to be amplified and having its output coupled to the base B of a bipolar transistor 2. The emitter E of the transistor 2 is connected to a ground potential M used as a reference potential and the collector C of the transistor 2 is coupled to the input of an impedance transformer 3, $T_s$, the output of which delivers the signal S which is the amplified input signal E. A bias circuit 4 of the collector C of the transistor 2, demarcated by a box formed by dashes, has a coil or choke 5 positioned between the point of application $V_c$ of the collector voltage and the collector C of the transistor 2. The point $V_c$ is connected to the ground potential M by means of a decoupling circuit 6. Similarly, a bias circuit 7 of the base B of the transistor 2, demarcated by a box formed by dashes, comprises a coil or choke 8 positioned between the point of application $V_B$ of the base voltage and the base B of the transistor 2. The point $V_B$ is connected to the ground potential M by means of a capacitor 9.

Figure 2:
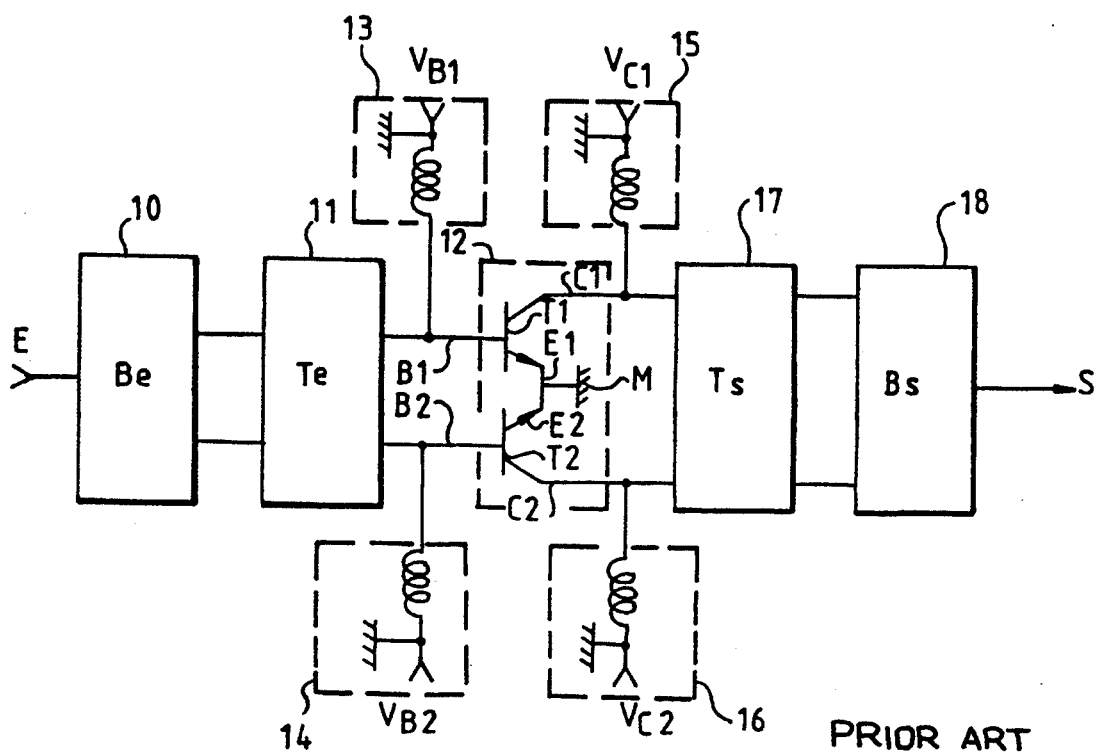

The electrical diagram of FIG. 2 describes an embodiment of an amplifier with dual transistors based on the electrical diagram of FIG. 1.

The input signal E is applied to the input of a balancing transformer $B_e$ or balun 10. The input balun 10 is coupled by its two outputs to an impedance transformer 11, $T_e$, the two outputs of which are coupled respectively to the base $B_1$ and $B_2$ of two transistors $T_1$ and $T_2$ constituting an amplifier stage 12 shown within a box formed by dashes. The emitters $E_1$ and $E_2$ of the two transistors $T_1$ and $T_2$ are connected to the ground potential M. The bias circuits 13, 14, 15 and 16 are identical to those described in the foregoing electrical drawing and shall not be described again. They respectively supply the base $B_1$ and $B_2$ and the collector $C_1$ and $C_2$ of each transistor referenced $T_1$ and $T_2$. Each collector $C_1$ and $C_2$ is connected respectively to an input of an impedance transformer $T_s$, 17, the two outputs of which are coupled to a balancing transformer $B_s$, 18 delivering, at its output, a signal S corresponding to the input signal E amplified.

Figure 3:
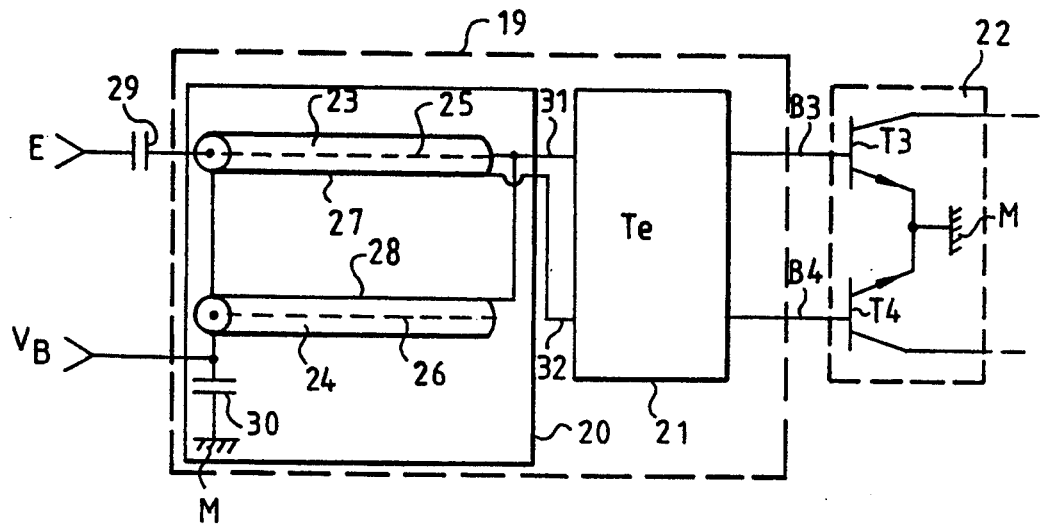

The electrical diagram of FIG. 3 shows an input circuit 19 demarcated by a box formed by dashes, coupled at its output to an amplifier stage 22 comprising two transistors $T_3$ and $T_4$, also demarcated by a box formed by dashes, this amplifier stage 22 being of the same type as in the foregoing figure. At its input, the circuit 19 has a balun 20 coupled at an output thereof to an impedance transformer $T_e$, 21. In this drawing, the base bias voltage is not applied to the base of the transistor by means of a choke but to one of the two inputs $V_B$ of the balun 20, the other input receiving the signal E to be amplified.

The balun 20 of the input circuit 19 has two transmission line sections 23 and 24 which are for example coaxial, positioned in parallel, and have identical lengths ranging from the wavelength $\lambda/8$ to the wavelength $3\lambda/8$, the magnitude A corresponding to the wavelength of the carrier of the signal to be amplified, thus covering the passband of the amplifier. Each coaxial line section 23 and 24 comprises respectively a central conductor 25 and 26 represented in the figure by sections of dashed line, and an external conductor 27 and 28. The input signal E is coupled to the central conductor 25 of the first line section 23 by means of a linking conductor 29. The end, on the input signal E side, of the external conductor 27 of the first section 23 is connected on the same side to the end of the external conductor 28 of the second section 24, which is itself connected to the ground potential M by means of a capacitor 30. The bias voltage of the bases $B_3$ and $B_4$ of the amplifier stage 22 is applied to the point $V_B$, namely to the terminal of the capacitor 30 opposite the terminal connected to the ground potential M.

The central conductor 25 of the section 23 is coupled by its other end to one input 31 of the two inputs 31 and 32 of an impedance transformer $T_E$, 21, and the external conductor 27 of the same end is coupled to the second input 32 of transformer 21.

The central conductor 26 of the section 24 is not connected. The external conductor 28 of the section 24, at its other end, is coupled to the first input 31 of the transformer referenced $T_E$, 21. The two outputs of the transformer $T_e$, 21 are coupled respectively to the two bases $B_3$ and $B_4$ of the amplifier stage 22. In this embodiment, only the external conductor 28 of the second section 24 is used. It symmetrizes the impedances with respect to the ground potential M of the balun 20 and furthermore enables a continuous link between the point of application $V_B$ and the bases $B_3$ and $B_4$ of the transistors $T_3$ and $T_4$, it being assumed that the transformer $T_E$, 21 has a continuous link between its input and output terminals.

The collector circuit can be deduced from the input circuit 19 by symmetry with respect to the amplifier stage 22 and is therefore not described.

Figure 4:
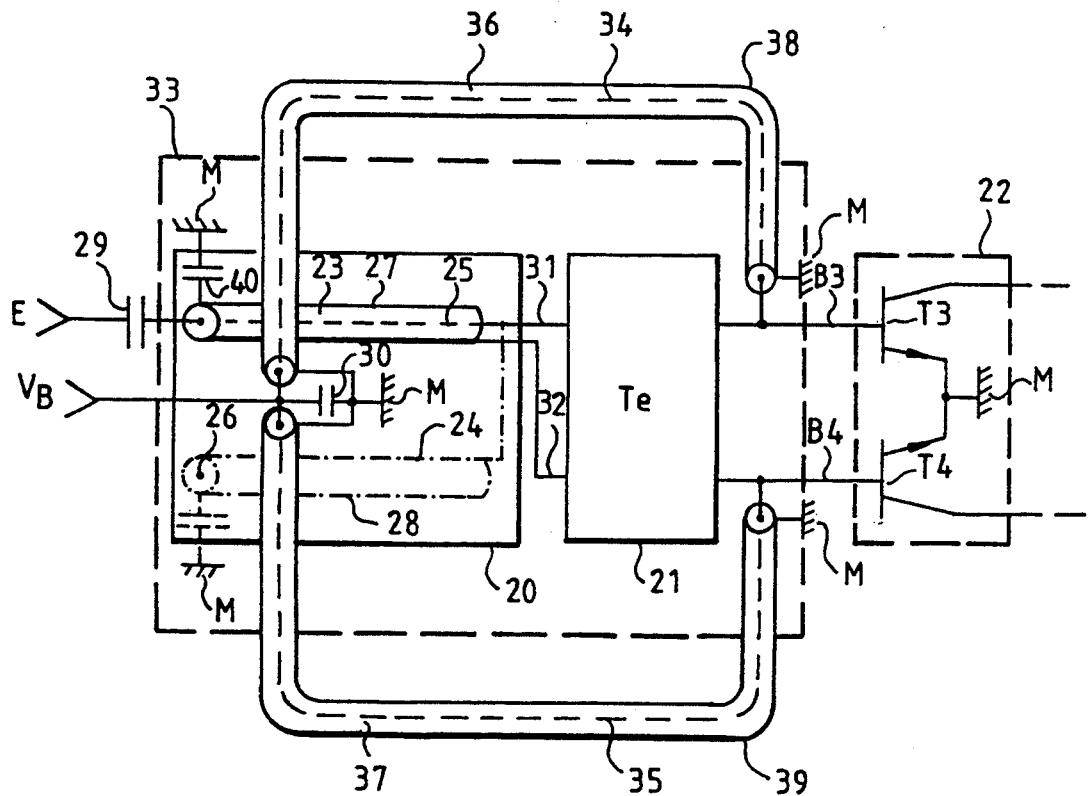
FIG. 4 shows an electrical diagram of the input circuit of an embodiment of an amplifier according to the invention.

An embodiment of an amplifier according to the invention is partially illustrated in FIG. 4 where the elements analogous to those of FIG. 3 are designated by the same reference numerals with a view to clarity. In this embodiment, the second section 24 of the input balun 20 as well as its connections are depicted by means of dots and dashes. The bias voltage common to the bases $B_3$ and $B_4$ of the amplifier stage 22, working for example in class AB mode, is applied to the common point $V_B$ at the ends of the central conductors 34 and 35, represented by a line of dashes, respectively corresponding to two coaxial line sections 36 and 37 that are identical in impedance and in length. They respectively convey the supply voltage from the bases $B_3$ and $B_4$, applied to the point $V_B$, up to the effective bases $B_3$ and $B_4$ of the dual transistor 22. The common point $V_B$ is connected to the ground potential M by the capacitor 30. The line sections 36 and 37 have a length ranging from the wavelength $\lambda/8$ to the wavelength $3\lambda/8$, $\lambda$ being the wavelength corresponding to the carrier of the signal. The external conductors 38 and 39 respectively corresponding to the line sections 36 and 37 are directly connected to the ground potential M at their two ends. The high-frequency impedance brought by the lines 36 and 37 in parallel to the bases $B_3$ and $B_4$ of the amplifier stage 22 is high as compared with the impedances shown by transistors $T_3$ and $T_4$ and therefore does not affect their operation in high frequency. The impedance in the video baseband is all the lower as the coaxial line used is a low-impedance line.

Since the amplifier stage 22 works as a differential amplifier, the perfect symmetry of the line sections 36 and 37 provides for perfect common-mode rejection.

The input circuit 33, constituted by the balun 20 and the impedance transformer 21, recovers its independence in relation to the electrical continuity that was ensured between the input terminals and the output terminals of the input circuit 19 of the assembly of FIG. 3. Consequently, the second coaxial line section is no longer indispensable for the transmission of the DC current and may be eliminated or kept as desired by the manufacturer of the amplifier. In both cases, a decoupling capacitor 40 is positioned between the external conductor 27 of the input side end of the line section 23, and the same is done for the section 24 if it is used.

The application of the collector voltage is done by means of a circuit that is symmetrical, with respect to the amplifier stage 22, to the input circuit 33 and the line sections 36 and 37, and is therefore not described in the present description.

Figure 5:
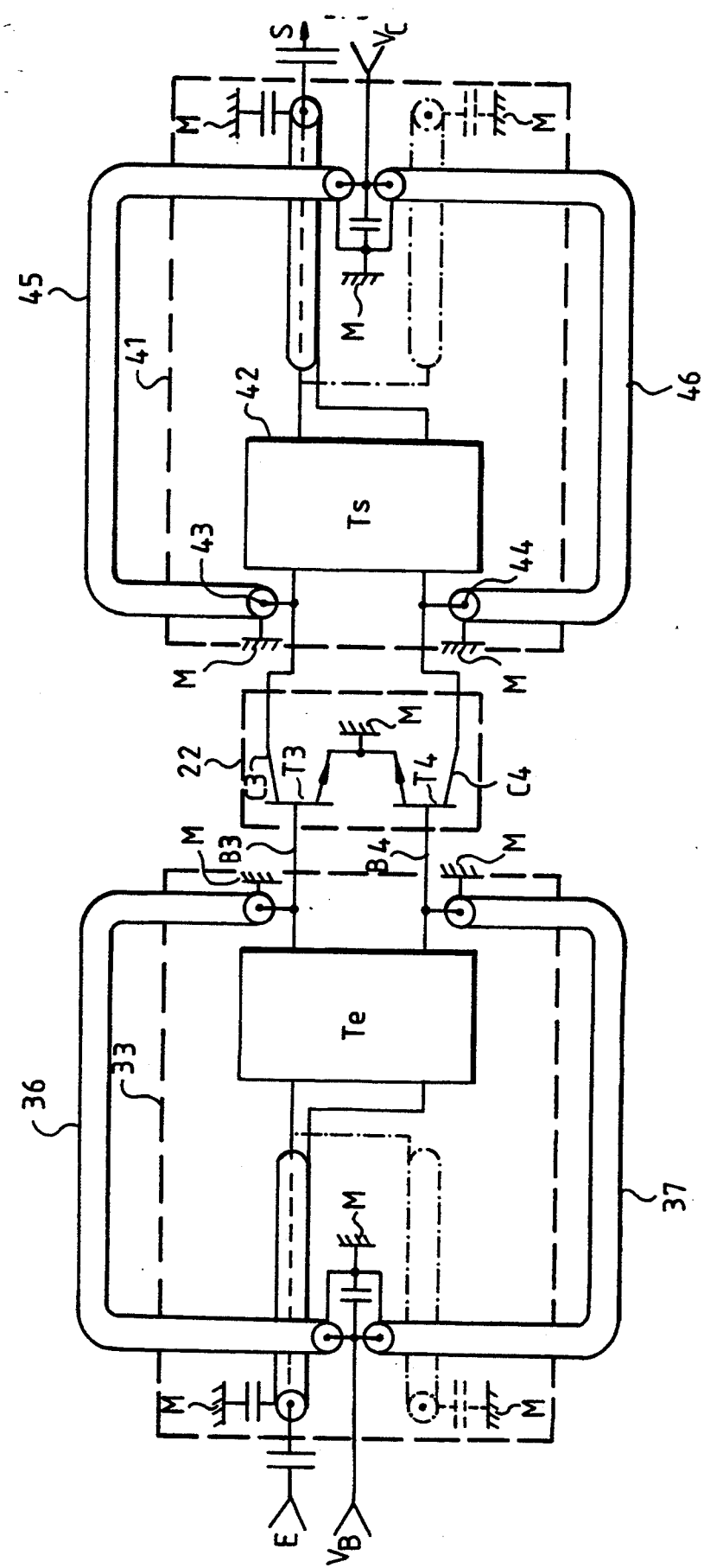
FIG. 5 shows a complete electrical diagram of the embodiment of FIG. 4.

FIG. 5 illustrates a complete embodiment of an amplifier according to the invention. In this figure, the elements analogous to those of the foregoing figures are designated by the same references. The input signal E and the common supply voltage of the bases $B_3$ and $B_4$ of the amplifier stage 22 are applied to the input circuit 33. The two outputs of the circuit 33 are respectively coupled to the bases $B_3$ and $B_4$ of the amplifier stage 22, of which the two outputs, corresponding respectively to the collectors $C_3$ and $C_4$ of the transistors $T_3$ and $T_4$, are coupled respectively to the two inputs of an output circuit 41 demarcated by a box formed by dashes, said circuit 41 being symmetrical, with respect to the amplifier stage 22, to the input circuit 33 and to the line sections 36 and 37. The two inputs of the output circuit 41 also correspond respectively to the two inputs of an output impedance transformer $T_s$, 42 as well as to the central conductors 43 and 44 of two line sections 45 and 46 conveying the collector voltage applied to the point $V_c$ to each collector $C_3$ and $C_4$ of the transistors $T_3$ and $T_4$. These two line sections 45 and 46 are identical in length and impedance. Their length ranges from the length $\lambda/8$ to the length $3\lambda/8$, corresponding to fractions of the wavelength of the carrier of the signal E to be amplified.

The signal S of the output circuit 41 corresponds to the input signal E amplified.

The invention is not strictly restricted to the embodiment described. In particular, the sections of transmission lines used may be made by another technology that is generally used to make high-impedance circuits such as, for example, the technology of microstrip lines.

What is claimed is:

1. A high-frequency wideband power amplifier organized around a ground circuit used as a reference potential, of the type comprising, in succession from an input to an output, a first balancing transformer, to an input of which there is injected a signal E to be amplified, an input impedance transformer, an amplifier stage comprising at least two transistors, an output impedance transformer and a second balancing transformer delivering the input signal E as an amplified signal S, wherein said amplifier further comprises a plurality of high-frequency transmission line sections transmitting a plurality of bias voltages to input and output terminals of said amplifier stage such that a high-frequency impedance is seen at said input and output terminals of said amplifier stage, wherein said high-frequency impedance is negligible in relation to a high-frequency impedance seen at each transistor terminal and a negligible series impedance exists at said input and output terminals of said amplifier stage with respect to a baseband of the signal E to be amplified such that the bias voltage applied to one end of each of the line sections is transmitted almost identically to the other end thereof which is connected to a transistor terminal, each line section respectively transmitting an input bias voltage to each transistor having an identical high-frequency impedance and identical length ranging from $\lambda/8$ to $3\lambda/8$, where $\lambda$ corresponds to a wavelength of a carrier of the signal E to be amplified, and wherein each line section respectively transmits an output bias voltage to each transistor and has identical impedance and identical length ranging from $\lambda/8$ to $3\lambda/8$.

2. An amplifier according to claim 1, wherein each high-frequency transmission line section is a coaxial line section such that an internal conductor of the section transmits the bias voltage between these two ends, and an external conductor of the section is coupled at opposite ends thereof to a reference potential.

3. An amplifier according to claim 1, wherein each high-frequency transmission line section is a microstrip line section wherein a metal strip transmits the bias voltage between opposite ends of said metal strip such that a metallized plane opposite the metal strip is coupled at opposite ends thereof to the reference potential.

4. An amplifier according to claim 1, wherein the transistors are bipolar transistors working in class AB mode.

* * * * *